United States Patent [19]
Kent et al.

[11] Patent Number: 6,047,084
[45] Date of Patent: Apr. 4, 2000

[54] METHOD FOR DETERMINING ACCURACY OF A CIRCUIT ASSEMBLY PROCESS AND MACHINE EMPLOYING THE SAME

[75] Inventors: Kevin Kent, Woodstock; Gregory Rahn, Sugar Grove; Kenneth A. Tarbell, Bartlett, all of Ill.

[73] Assignee: Motorola, Inc., Schaumburg, Ill.

[21] Appl. No.: 08/972,554

[22] Filed: Nov. 18, 1997

[51] Int. Cl.[7] .................................................... G06K 9/00
[52] U.S. Cl. ........................ 382/147; 382/151; 348/126
[58] Field of Search ................................. 382/145, 147, 382/149, 151, 141, 150; 348/125, 126

[56] References Cited

U.S. PATENT DOCUMENTS

| | | | |
|---|---|---|---|
| 4,866,837 | 9/1989 | Heissenberger | 29/741 |
| 4,941,256 | 7/1990 | Capson et al. | 29/833 |
| 4,953,100 | 8/1990 | Yotsuya | 364/559 |
| 4,989,082 | 1/1991 | Hopkins | 382/151 |
| 5,023,916 | 6/1991 | Breu | 382/8 |
| 5,293,324 | 3/1994 | Tokura | 364/552 |

FOREIGN PATENT DOCUMENTS 10-224100  8/1998  Japan .

OTHER PUBLICATIONS

Cyberoptics News Release, "LSM2 Inspection System For SMT," Feb. 18, 1997, http://www.cyberoptics.com/lsm2news.htm, Wednesday, Aug. 6, 1997.

Cyberoptics News Release, "New Sentry is 3X Faxter," May 22, 1997, http://www.cyberoptics.com/2000news.htm, Wednesday, Aug. 6, 1997.

Cyberoptics Lsm2™ Inspection System, pp. 1–2, http://www.cyberoptics.com/lsm2data.htm, Wednesday, Aug. 6, 1997.

Cyberoptics Sentry™ 2000, pp. 1–2, http://www.cyberoptics.com/sntrydat.htm, Wednesday, Aug. 6, 1997.

SVS 8100, SMT Inspection System http://www.vieweng.com/view05.html, Wednesday, Aug. 6, 1997.

Voyager, Model V12×12, http://www.vieweng.com/view08.html, Wednesday, Aug. 6, 1997.

Cyberoptics, Out Technology, Non–contact Measurement Experts, http://www.cyberoptics.com/Tech.htm, Wednesday, Aug. 6, 1997.

SVS 8100, SMT Measurement System, General Scanning, Inc., View Engineering Division, 4 pages. 1997.

Voyager Series, Models V12×12, V18×18, & V18×24, General Scanning, Inc., View Engineering Division, Metrology Products Group, 2 pages. 1997.

MVT GS–1: In–Line Component Placement Measurement, M V Technology, Ltd., 4 pages. 1997.

*Primary Examiner*—Thomas D Lee
*Attorney, Agent, or Firm*—Mark D. Patrick

[57] ABSTRACT

Accuracy of a circuit assembly process (100) is determined by capturing an image (306, 1008) of an assembly formed on a substrate by the circuit assembly process (100), calculating coverage (310, 1012, 1024) of the assembly from the image, and comparing the coverage (312, 1016, 1026) to a threshold.

18 Claims, 8 Drawing Sheets

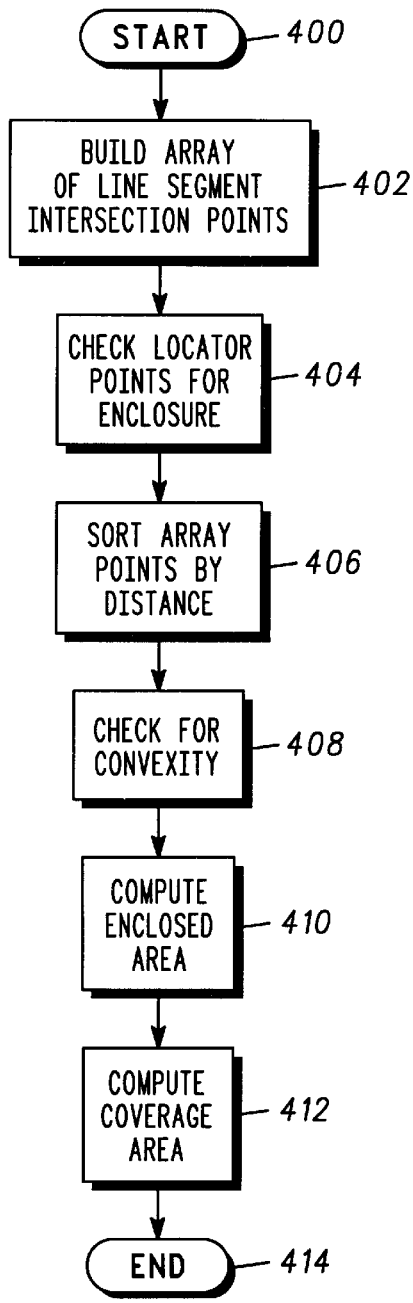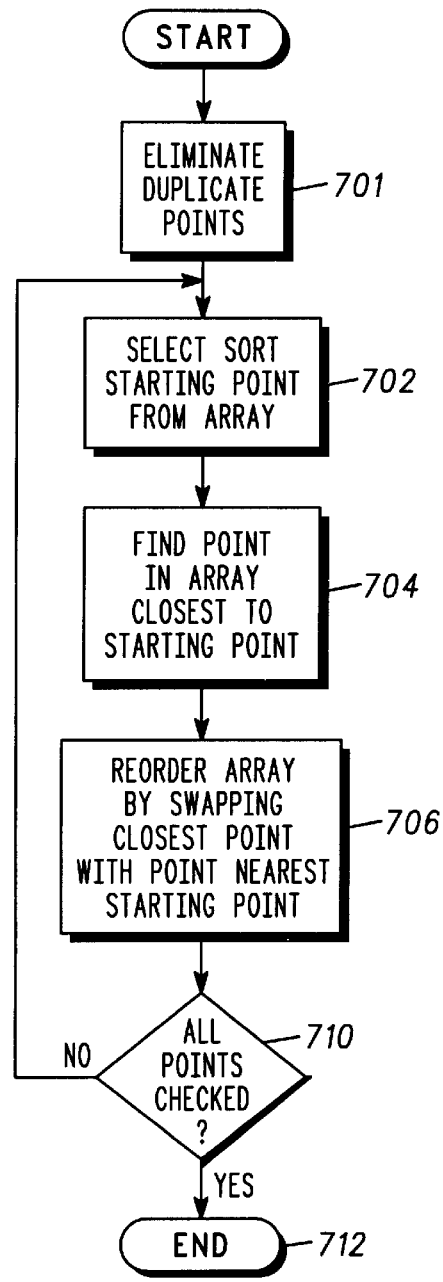
FIG. 4
FIG. 7

METHOD FOR DETERMINING ACCURACY OF A CIRCUIT ASSEMBLY PROCESS AND MACHINE EMPLOYING THE SAME

FIELD OF THE INVENTION

This invention relates generally to circuit assembly processes and, more particularly, to determining the accuracy of a circuit assembly process.

BACKGROUND OF THE INVENTION

Many electronic devices include one or more substrates having a circuit assembly assembled thereon. In order to manufacture high quality electronic devices in a cost effective manner, it is necessary to assemble the circuit assembly to the substrate at a high speed and with great precision. These goals are achieved through an automated circuit assembly process that is quality controlled.

One such automated circuit assembly process employs an automated printing machine to print solder paste on predetermined sites of a substrate and an automated placement machine to place an electronic part such that its leads contact the solder paste. To ensure that the electronic part is accurately placed, the automated circuit assembly process employs a vision inspection system to inspect the electronic part. The inspection system detects the location of the electronic part and compares the detected location to a prestored ideal location. From the difference in the detected and ideal locations, the inspection system determines a longitudinal axis or x-coordinate offset, a transverse or y-coordinate offset, and an offset value indicating the amount of rotation of the electronic part. When any of the offsets, individually, exceed a predetermined offset limit, the inspection system rejects the electronic part and indicates that the placement machine must be adjusted.

However, whenever offsets are evaluated individually as described above, there exists a possibility that reliable mechanical and electrical connectivity of the contacts of the electronic part to the site could still be achieved even though one or more of the offsets indicate that the electronic part is misplaced. This is particularly true in an assembly process that employs a single set of ideal locations for the electronic part but uses different suppliers to supply electronic parts with the same electrical function but slightly different mechanical features.

Therefore, what is needed is an improved inspection method that bases part rejection on mechanical and electrical connectivity capability rather than on the relative location of the part, thereby minimizing excessive rejection rates that can seriously impact capacity and throughput for the automated circuit assembly process.

BRIEF DESCRIPTION OF THE DRAWINGS

FIG. 4 is a flow chart illustrating a method of calculating placement coverage area in the circuit assembly process of FIG. 1;

FIG. 7 is a flow chart illustrating a method of sorting array points by distance of the method of calculating placement coverage area of FIG. 4;

DETAILED DESCRIPTION OF THE PREFERRED EMBODIMENTS

Accuracy of a circuit assembly process is measured by detecting and evaluating the coverage of the assembly. In one step of the circuit assembly process, solder paste is placed on pads of a substrate site. Accuracy of the solder paste placement is determined by detecting and evaluating the amount of solder paste and pad overlap. In another step of the circuit assembly process, electronic parts are placed such that leads thereof contact the pads of the substrate site. Accuracy of the electronic part placement is determined by detecting and evaluating the amount of lead and pad overlap. Unlike the prior art processes that detect a location of the paste or part, the present processes detect the location of the paste or part and evaluates the interaction between the paste and the site and/or part and the site. By evaluating the interaction, assembly rejections can be based on mechanical and electrical connectivity capability and excessive rejection rates can be minimized.

Figure 1:
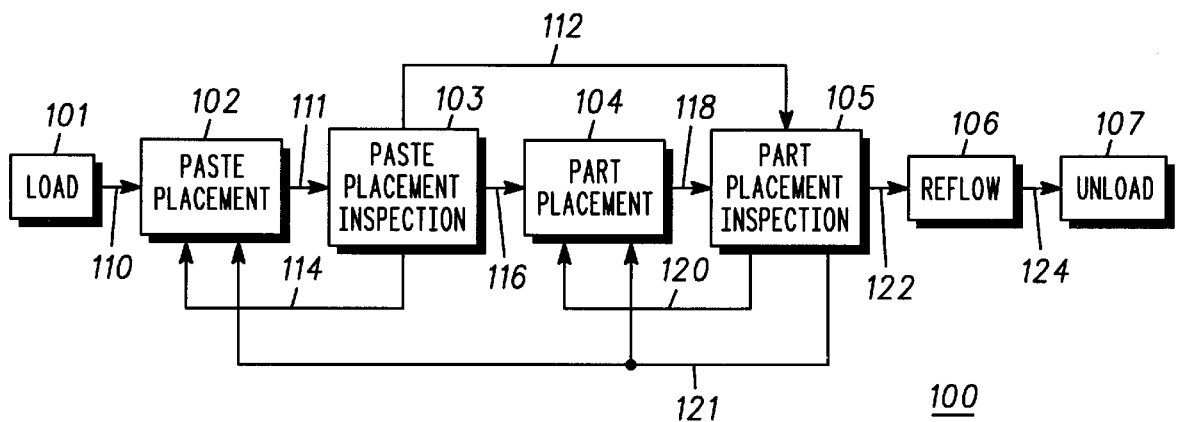
FIG. 1 is a block diagram illustrating a circuit assembly process.

A circuit assembly process 100 of FIG. 1 assembles electronic parts to substrates to form electrical circuits. The assembly process 100 includes a load step 101, a paste placement step 102, a paste placement inspection step 103, a part placement step 104, a part placement inspection step 105, a reflow step 106, and an unload step 107. At the load step 101, one or more of a known substrate, particularly an unpopulated printed circuit board panel, is inserted into the assembly process 100. The load step 101 is performed by a known automated board handler machine or other suitable alternative that outputs panels, one at a time, onto a conveyor.

Figure 2:
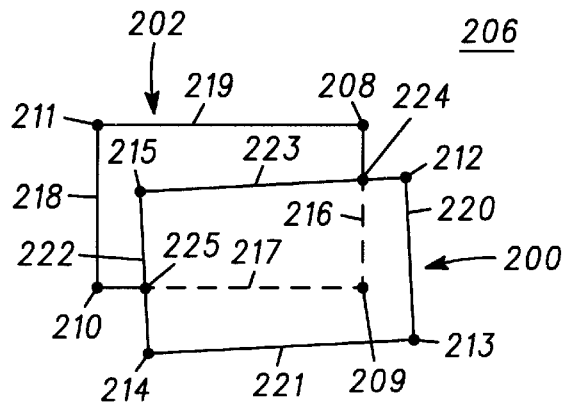
FIG. 2 is an enlarged, top plan view of a site of a substrate in the circuit assembly process of FIG. 1 following a paste placement step thereof.
Figure 2:
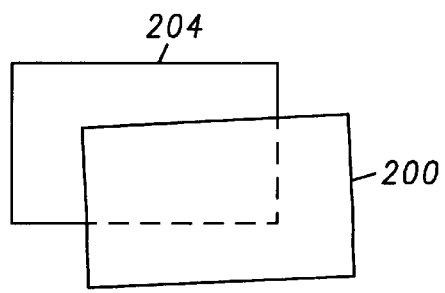

Following the load step 101, the circuit assembly process 100 proceeds to the paste placement step 102, as depicted by arrow 110. During the paste placement step 102, solder paste, such as solder paste 200 of FIG. 2, is placed on pads, such as pads 202 and 204, of sites, such as site 206, of the substrate to form assemblies having a solder paste component and a pad component. The solder paste 200 is a known tin-lead solder paste or suitable alternative. Placement of the solder paste 200 is performed by a known automated screen printer. The screen printer receives and locates the substrate; places a stencil over the substrate and the site 206 such that pads 202 and 204 line up with openings in the stencil; and wipes the solder paste 200 across the stencil thereby depositing the solder paste 200 on pads 202 and 204. Sometimes, however, the stencil and the substrate are misaligned due to, for example, operator setup error or normal wear and tear, and the solder paste 200 is inaccurately deposited.

Following the paste placement step 102 of FIG. 1, the circuit assembly process 100 proceeds to the paste placement inspection step 103, as depicted by arrow 111. At the paste placement inspection step 103, all of the sites of the substrate, including site 206 of FIG. 2, are measured to determine the accuracy of the paste placement step 102 of FIG. 1. Measurement is performed by a solder paste placement measurement machine such as a SVS 8100 SMT Measurement System manufactured and sold by General Scanning Inc., a Sentry™ 2000 In-Line Inspection System manufactured and sold by CyberOptics, or other suitable two-dimensional or three-dimensional sensing system.

Figure 3:
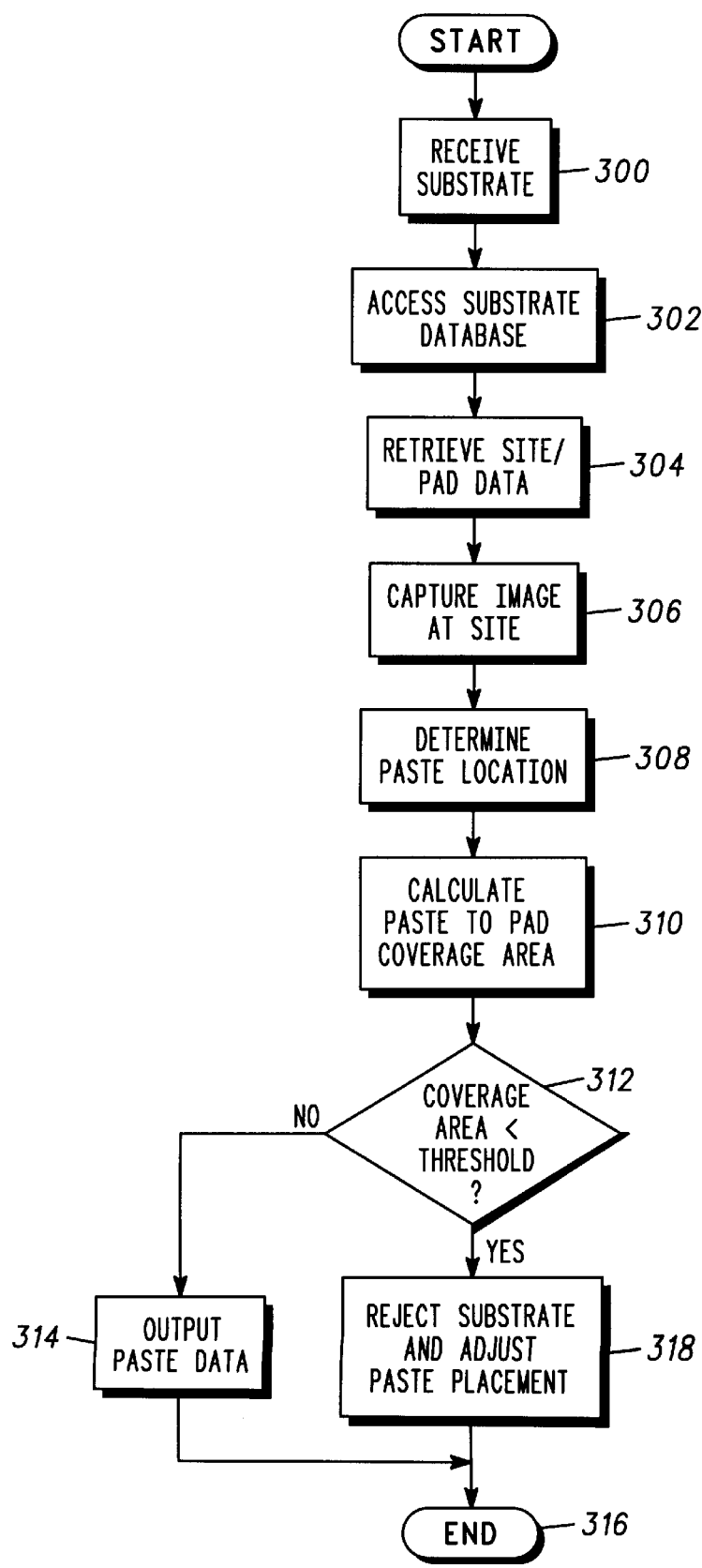
FIG. 3 is a flow chart illustrating a paste placement inspection step of the circuit assembly process of FIG. 1.

The paste placement inspection step 103 comprises a method shown in FIG. 3 for determining the accuracy of the paste placement step 102 of FIG. 1. Steps of the method of FIG. 3 are defined in software instructions that are stored in a memory section of the paste placement measurement machine and executed by a processing section of the paste placement measurement machine. Initially, the paste placement measurement machine receives the substrate and positions it for inspection (at step 300). The paste placement measurement machine accesses a database of prestored data corresponding to the topology of the substrate (at step 302). The paste placement measurement machine retrieves data from the database that indicates the location of a site to inspect, such as site 206 of FIG. 2, and the coordinates of locator points of one pad of the site, such as corner points 208–211 of pad 202 of FIG. 2 (at step 304). Using the retrieved data, the paste placement measurement machine captures an image at site 206 using its vision section (at step 306). In the illustrated embodiment, the image is a two-dimensional representation of the site 206. The paste placement measurement machine processes the image using a known method, such as laser triangulation, to determine coordinates of corner points 212–215 of the solder paste 200 relative to pad 202 (at step 308). In the illustrated embodiment, the coordinates of the corner points 208–211 of pad 202 are (18, 15.5), (18, 4), (0, 4.0), and (0, 15.5), respectively, and the coordinates of corner points 212–215 of the solder paste 200 are (20.5, 13), (21.5, 1.5), (4.0, 0), and (2.5, 11.25), respectively.

Next, the paste placement inspection step 103 proceeds to calculate paste to pad coverage (at step 310). One method of calculating coverage is shown in FIG. 4. Initially, the components of the assembly are modeled as two-dimensional, coplanar polygons described by a series of line segments (at step 400). In the illustrated embodiment, the solder paste 200 of FIG. 2 is modeled as one polygon and pad 202 is modeled as another polygon.

An array of line segment intersection points is built (at step 402). The array is built using a method shown in FIG. 5. Locator points of each polygon are connected to construct line segments (at step 502). Next, two line segments, one from each polygon, are selected to check for intersection (at step 504). The slope and intercept of each of the selected line segments is determined (at step 506). The slope of a line segment is determined to be infinite when the x coordinates of the corner points of the line segment are equal. If the x coordinates of the line segment are not equal, the slope is finite and is calculated by dividing the difference of the y coordinates of the corner points of the line segment by the difference of the x coordinates of the corner points of the line segment. The intercept of a line segment is calculated by subtracting the product of the slope and the x coordinate of one of the corner points from the y coordinate of the same one of the corner points.

If both of the selected line segments are vertical (i.e., have infinite slopes) (at step 508) or both of the line segments are non-vertical (i.e., have finite slopes) and equal (at step 510), no intersection point results and the method proceeds to select additional pairs of line segments to check for intersection (at step 512 and 504). The line segments are selected such that each line segment of one polygon is checked for intersection with each line segment of the other polygon. If all of the line segments have been checked for intersection, the method ends (at step 514).

If one of the selected line segments is vertical and the other one of the selected line segments is non-vertical (at step 516), an intersection point of the vertical and non-vertical line segments is calculated (at step 518). The x coordinate of the intersection point equals the x coordinate of the corner point of the vertical line segment. The y coordinate of the intersection point is calculated by adding the intercept of the non-vertical line segment to the product of the x coordinate of the intersection point and the slope of the non-vertical line segment. Next, the intersection point is checked to see if it lies between the locator points of both of the selected line segments (at step 520). If so, the coordinates of the intersection point are stored as an element in the array of line segment intersection points (at step 522) and the method proceeds to step 512. If the intersection point does not lie on the selected line segments (at step 520), the method proceeds directly to step 512.

If both of the selected line segments are non-vertical and their slopes are not equal (at step 516), an intersection point of two non-vertical line segments is calculated (at step 524). The x coordinate of the intersection point is calculated by taking the negative value of the quotient of the difference of the intercepts of the line segments and the difference of the slopes of the line segments. The y coordinate of the intersection point is calculated by adding the intercept of one of the line segments to the product of the slope of the same one of the line segments and the x coordinate of the intersection point. Once the intersection point is determined, the method proceeds to step 520.

Figure 5:
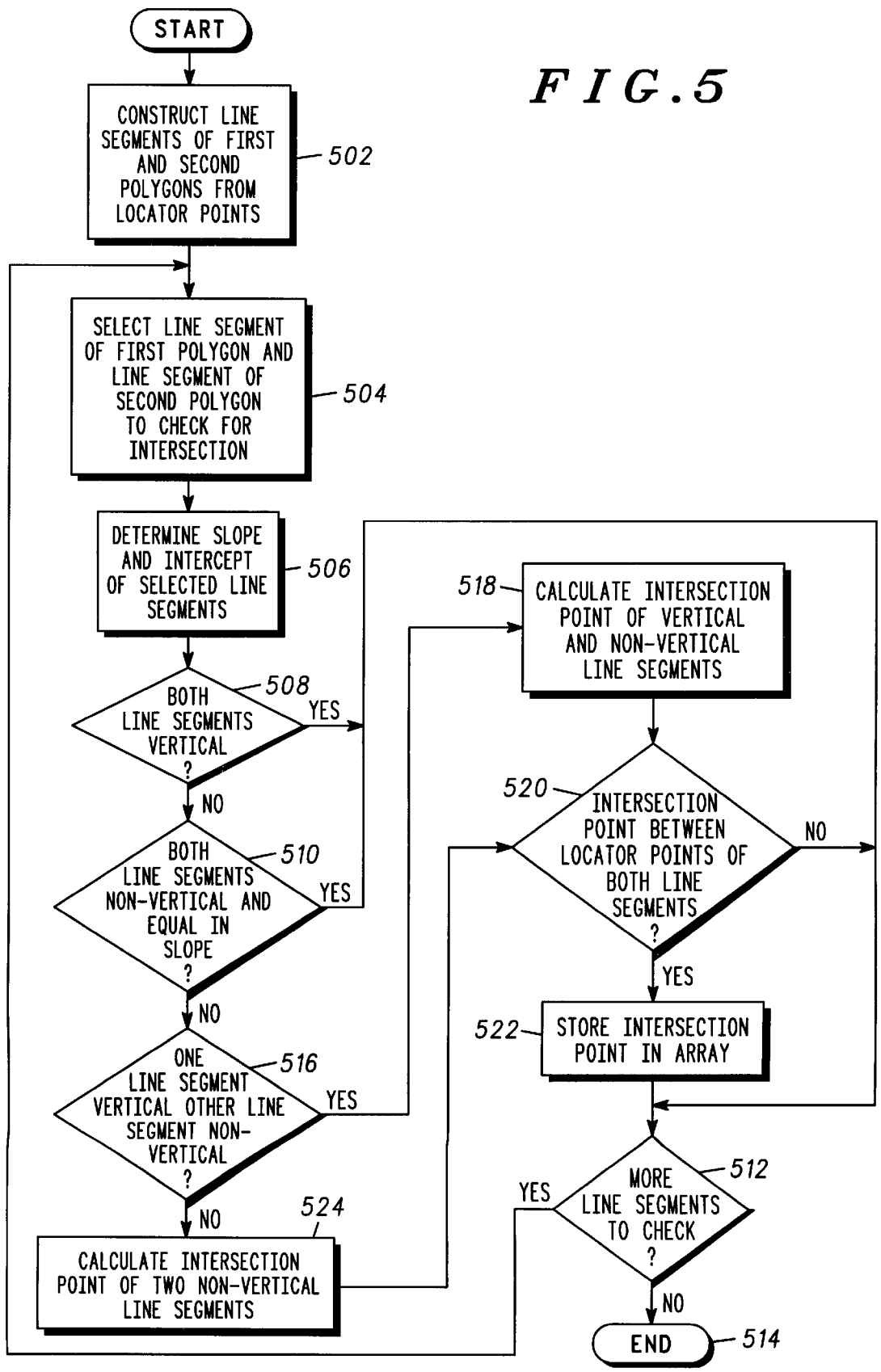
FIG. 5 is a flow chart illustrating a method of building an array of line segment intersection points of the method of calculating placement coverage area of FIG. 4.

Application of the method of FIG. 5 to the embodiment illustrated in FIG. 2 is depicted in TABLE 1 below, which is summarized as follows. The corner points 208–211 are connected along the sides of pad 202 to define line segments 216–219, and the corner points 212–215 are connected along the sides of the solder paste 200 to define line segments 220–223. Each one of the line segments 216–219 is checked for intersection with each one of line segments 220–223 and the following 1 by 2 array of intersection points results: [(18,12.75)(3.47,4)]. The array element [1,1] is intersection point 224 resulting from the check of line segments 216 and 223, and the array element [1,2] is intersection point 225 resulting from the check of line segments 217 and 222.

TABLE 1

| Locator Pts of Line Segs 1/2 | Line Segs 1/2 | Slope of Line Seg 1 | Slope of Line Seg 2 | Intercept of Line Seg 1 | Intercept of Line Seg 2 | Intersect Pt | Intersect Pt b/t Locator Pts of Line Segs 1&2? | Intersect Pt in Array/ Location in Array |
|---|---|---|---|---|---|---|---|---|
| (18,15.5)(18,4)/ (20.5,13)(21.5,1.5) | 216/220 | infinite | −11.5 | infinite | 248.75 | (18,41.75) | NO | — |
| "/(21.5,1.5)(4,0) | 216/221 | infinite | 0.0857 | infinite | −0.3426 | (18,1.2) | NO | — |

TABLE 1-continued

| Locator Pts of Line Segs 1/2 | Line Segs 1/2 | Slope of Line Seg 1 | Slope of Line Seg 2 | Intercept of Line Seg 1 | Intercept of Line Seg 2 | Intersect Pt | Intersect Pt b/t Locator Pts of Line Segs 1&2? | Intersect Pt in Array/ Location in Array |
|---|---|---|---|---|---|---|---|---|
| "/(4,0)(2.5,11.25) | 216/222 | infinite | −7.5 | infinite | 30 | (18,−105) | NO | — |
| "/(2.5,11.25)(20.5,13) | 216/223 | infinite | 0.0972 | infinite | 11.007 | (18,12.75) | YES | (18,12.75)/[1,1] |
| (18,4)(0,4)/(20.5,13)(21.5,1.5) | 217/220 | 0 | −11.5 | 4 | 248.75 | (21.28,4) | NO | — |
| "/(21.5,1.5)(4,0) | 217/221 | 0 | 0.0857 | 4 | −0.3426 | (50.67,4) | NO | — |
| "/(4,0)(2.5,11.25) | 217/222 | 0 | −7.5 | 4 | 30 | (3.47,4) | YES | (3.47,4)/[1,2] |
| "/(2.5,11.25)(20.5,13) | 217/223 | 0 | 0.0972 | 4 | 11.007 | (−72.09,4) | NO | — |
| (0,4)(0,15.5)/(20.5,13)(21.5,1.5) | 218/220 | infinite | −11.5 | infinite | 248.75 | (0,248.75) | NO | — |
| "/(21.5,1.5)(4,0) | 218/221 | infinite | 0.0857 | infinite | −0.3426 | (0,−0.3426) | NO | — |
| "/(4,0)(2.5,11.25) | 218/222 | infinite | −7.5 | infinite | 30 | (0,30) | NO | — |
| "/(2.5,11.25)(20.5,13) | 218/223 | infinite | 0.0972 | infinite | 11.007 | (0,11.007) | NO | — |
| (0,15.5)(18,15.5)/(20.5,13)(21.5,1.5) | 219/220 | 0 | −11.5 | 15.5 | 248.75 | (20.28,15.5) | NO | — |
| "/(21.5,1.5)(4,0) | 219/221 | 0 | 0.0857 | 15.5 | −0.3426 | (−184.86,15.5) | NO | — |
| "/(4,0)(2.5,11.25) | 219/222 | 0 | −7.5 | 15.5 | 30 | (1.933,15.5) | NO | — |
| "/(2.5,11.25)(20.5,13) | 219/223 | 0 | 0.0972 | 15.5 | 11.007 | (46.224,15.5) | NO | — |

Once the array of intersection points is built at step 402 of FIG. 4, the locator points of the line segment are checked for enclosure within the polygons (at step 404). The locator points are checked for enclosure using a method shown in FIG. 6. A locator point of one polygon is selected to be tested for enclosure within the boundary formed by the line segments of the other polygon (at step 602). A line segment is selected from the other polygon (at step 604). A reference point of the other polygon is also selected (at step 606). The reference point is selected to be any locator point of the other polygon aside from the two locator points of the selected line segment. Next, the selected locator point and the selected reference point are checked to see if they reside on the same side of the selected line segment (at step 608). When checking for enclosure of the locator points, each polygon is assumed to be convex such that all locator points are on the same side of any other locator point or line segment connecting locator points. When the selected line segment is vertical and has an infinite slope, the selected locator point and the selected reference point reside on the same side of the selected line segment when the product of (1) the difference between the x coordinate of the selected locator point and the x coordinate of the selected line segment and (2) the difference of the x coordinate of the selected reference point and the x coordinate of the selected line segment is greater than zero, and reside on opposite sides of the selected line segment when the product of (1) the difference between the x coordinate of the selected locator point and the x coordinate of the selected line segment and (2) the difference between the x coordinate of the selected reference point and the x coordinate of the selected line segment is less than or equal to zero.

When the selected line segment is horizontal and has a zero slope (i.e., when the y coordinates of the locator points of the selected line segment are equal), the selected locator point and the selected reference point reside on the same side of the selected line segment when the product of (1) the difference between the y coordinate of the selected locator point and the y coordinate of the selected line segment and (2) the difference between the y coordinate of the selected reference point and the y coordinate of the selected line segment is greater than zero, and reside on opposite sides of the selected line segment when the product of (1) the difference between the y coordinate of the selected locator point and the y coordinate of the selected line segment and (2) the difference between the y coordinate of the selected reference point and the y coordinate of the selected line segment is less than or equal to zero.

When the selected line segment is neither vertical nor horizontal, the relatives location of the selected locator point and the selected reference point with respect to the selected line segment is determined as follows. First, the slope of the selected line segment is calculated by dividing (1) the difference of the y coordinates of its locator points by (2) the difference of the x coordinates of its locator points. Next, the intercept of the selected line segment is calculated by subtracting (1) the product of the x coordinate of the selected locator point and the slope of the selected line segment from (2) the y coordinate of the selected locator point. The selected locator and reference points are calculated to reside on the same side of the selected line segment when the product of (1) the difference of the y coordinate of the selected reference point and the sum of (a) the intercept of the selected line segment and (b) the product of (i) the x coordinate of the selected reference point and (ii) the slope of the selected line segment and (2) the difference of the y coordinate of the selected locator point and the sum of (a) the intercept of the selected line segment and (b) the product of (i) the x coordinate of the selected locator point and (ii) the slope of the selected line segment, are greater than zero. Alternatively, if this product results in a value less than or equal to zero, the selected locator and reference points reside on opposite sides of the selected line segment.

If the selected locator and reference points are found to reside on opposite sides of the selected line segment at step 608, the locator point is found to not be enclosed and the method proceeds to select the next locator point to check for enclosure (at steps 614 and 602). The locator points are selected such that the locator point of each polygon is checked for enclosure by the other polygon. If all of the locator points of the polygons have been checked, the method ends (at step 616).

If the selected locator and reference points are found to reside on the same side of the selected line segment at step 608, the method proceeds to determine if the selected locator point has been checked against all of the line segments of the other polygon (at step 610). If the selected locator point has not been checked against all of the line segments of the other polygon, the method returns to step 604 to select the next line segment of the other polygon to check the selected locator point against. If the locator point of the one polygon is found to reside on the same side of all of the line segments of the other polygon as the respective reference points, the locator point is deemed to be enclosed by the other polygon and is stored in the array of intersection points (at step 612). Following storage, the method proceeds to step 614.

Figure 6:
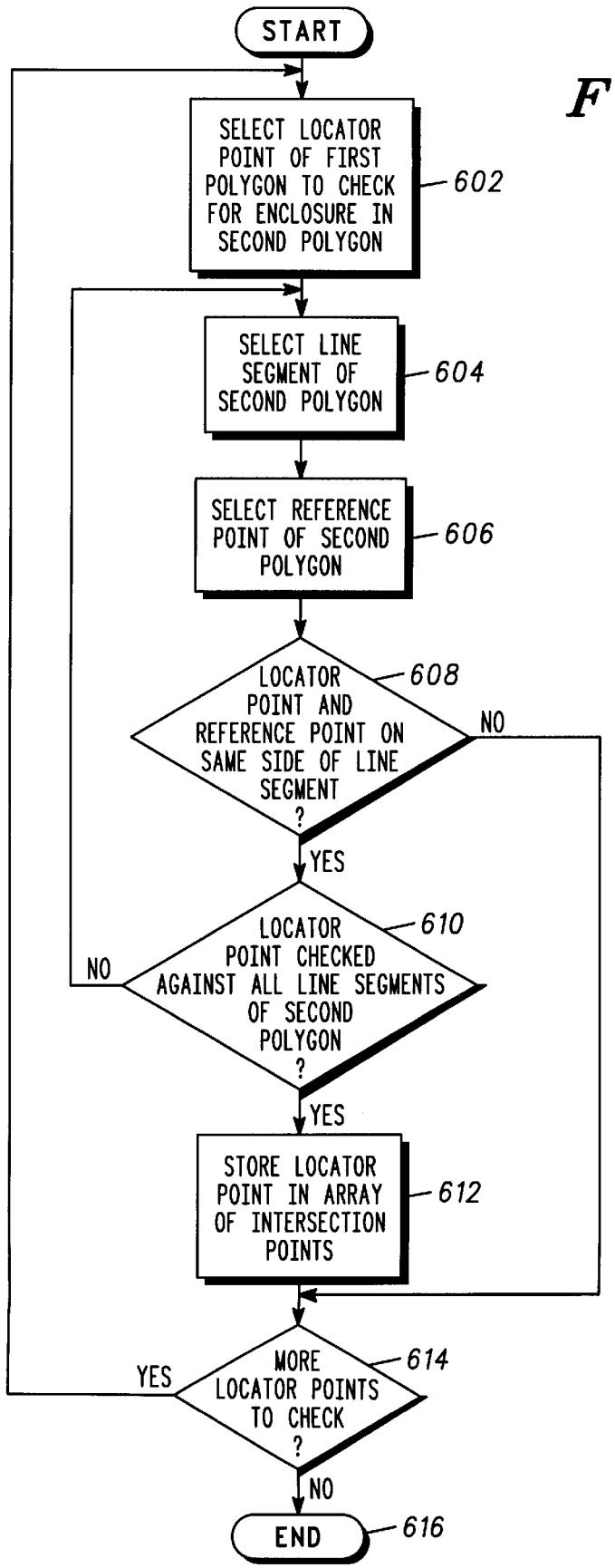
FIG. 6 is a flow chart illustrating a method of checking corner points for enclosure of the method of calculating placement coverage area of FIG. 4.

Application of the method of FIG. 6 to the embodiment illustrated in FIG. 2 is depicted in TABLE 2 below, which is summarized as follows. Each one of the corner points 208–211 of pad 202 is checked against each one of the line segments 220–223 of the paste 200, and each one of the corner points 212–215 of the paste 200 is checked against each one the line segments 216–219 of pad 202. The corner points 209 and 215 are found to be enclosed by the paste 200 and pad 202, respectively, and are stored as array elements [1,3] and [1,4], respectively, in the array of intersection points, which becomes the 1 by 4 array [(18,12.75)(3.47,4)(18,4)(2.5,11.25)].

TABLE 2

| Locator Pt (1st Poly)/ Locator Pt Coords | Line Seg (2nd Poly)/ Coords of Line Seq Pts | Ref Pt (2nd Poly) | Relative Location of Locator and Ref Pts to Vert Line Seg | Relative Location of Locator and Ref Pts to Horiz Line Seg | Slope of Non-Vert Non-Horiz Line Seg | Intercept of Non-Vert Non-Horiz Line Seg | Relative Location of Locator and Ref Pts to Non-Vert Non-Horiz Line Seg | Location > 0 (i.e., Locator and Ref Pts on Same Side of Line Seg)? | Locator Pt Enclosed by All Line Segs?/ Locator Pt in Array/ Location in Array |
|---|---|---|---|---|---|---|---|---|---|
| 208/ (18,15.5) | 220/ (20.5,13) (21.5,1.5) | (2.5,11.25) | — | — | −11.5 | 248.75 | 5479.688 | YES | — |
| 208/ (18,15.5) | 221/ (21.5,1.5) (4,0) | (20.5,13) | — | — | 0.0857 | −0.3426 | 165.676 | YES | — |
| 208/ (18,15.5) | 222/ (4,0) (2.5,11.25) | (21.5,1.5) | — | — | −7.5 | 30 | 15996.375 | YES | — |
| 208/ (18,15.5) | 223/ (2.5,11.25) (20.5,13) | (4,0) | — | — | 0.0972 | 11.007 | −31.263 | NO | NO |
| 209/ (18,4) | 220/ (20.5,13) (21.5,1.5) | (2.5,11.25) | — | — | −11.5 | 248.75 | 7880.313 | YES | — |
| 209/ (18,4) | 221/ (21.5,1.5) (4,0) | (20.5,13) | — | — | 0.0857 | −0.3426 | 32.440 | YES | — |
| 209/ (18,4) | 222/ (4,0) (2.5,11.25) | (21.5,1.5) | — | — | −7.5 | 30 | 14469.75 | YES | — |
| 209/ (18,4) | 223/ (2.5,11.25) (20.5,13) | (4,0) | — | — | 0.0972 | 11.007 | 99.788 | YES | YES/(18A)/ [1,3] |
| 210/ (0,4) | 220/ (20.5,13) (21.5,1.5) | (2.5,11.25) | — | — | −11.5 | 248.75 | 51091.563 | YES | — |
| 210/ (0,4) | 221/ (21.5,1.5) (4,0) | (20.5,13) | — | — | 0.0857 | −0.3426 | 50.312 | YES | — |
| 210/ (0,4) | 222/ (4,0) (2.5,11.25) | (21.5,1.5) | — | — | −7.5 | 30 | −3451.5 | NO | NO |
| 211/ (0,15.5) | 220/ (20.5,13) (21.5,1.5) | (2.5,11.25) | — | — | −11.5 | 248.75 | 48690.938 | YES | — |
| 211/ (0,15.5) | 221/ (21.5,1.5) (4,0) | (20.5,13) | — | — | 0.0857 | −0.3426 | 183.548 | YES | — |
| 211/ (0,15.5) | 222/ (4,0) (2.5,11.25) | (21.5,1.5) | — | — | −7.5 | 30 | −1924.875 | NO | NO |
| 212/ (20.5,13) | 216/ (18,15.5) (18,4) | (0,15.5) | −45 | — | — | — | — | NO | NO |
| 213/ (21.5,1.5) | 216/ (18,15.5) (18,4) | (0,15.5) | −63 | — | — | — | — | NO | NO |
| 214/ (4,0) | 216/ (18,15.5) (18,4) | (0,15.5) | 252 | — | — | — | — | YES | — |
| 214/ (4,0) | 217/ (18,4) (0,4) | (18,15.5) | — | −46 | — | — | — | NO | NO |
| 215/ (2.5, 11.25) | 216/ (18,15.5) (18,4) | (0,15.5) | 279 | — | — | — | — | YES | — |

TABLE 2-continued

| Locator Pt (1st Poly)/ Locator Pt Coords | Line Seg (2nd Poly)/ Coords of Line Seg Pts | Ref Pt (2nd Poly) | Relative Location of Locator and Ref Pts to Vert Line Seg | Relative Location of Locator and Ref Pts to Horiz Line Seg | Slope of Non-Vert Non-Horiz Line Seg | Intercept of Non-Vert Non-Horiz Line Seg | Relative Location of Locator and Ref Pts to Non-Vert Non-Horiz Line Seg | Location > 0 (i.e., Locator and Ref Pts on Same Side of Line Seg)? | Locator Pt Enclosed by All Line Segs?/ Locator Pt in Array/ Location in Array |
|---|---|---|---|---|---|---|---|---|---|
| 215/ (2.5, 11.25) | 217/ (18,4) (0,4) | (18,15.5) | — | 83.375 | — | — | — | YES | — |
| 215/ (2.5, 11.25) | 218/ (0,4) (0,15.5) | (18,4) | 45 | — | — | — | — | YES | — |
| 215/ (2.5, 11.25) | 219/ (0,15.5) (18,15.5) | (0,4) | — | 48.875 | — | — | — | YES | YES/(2.5,11.25)/ [1,4] |

Next, the points of the array are sorted by distance from one another to ensure that the points are ordered to form a convex polygon when sequentially traversed (at step 406). Sorting by distance is done using a method shown in FIG. 7. Initially, duplicate points of the array are eliminated (at step 701). One method of removing duplicate points includes deleting the duplicate point and shifting the points that are subsequently positioned to the duplicate point up one location in the array. Next, one of the points is selected from the array as a starting point for sorting (at step 702). Initially, the starting point is the point at the first location in the array. The distance between the starting point and each of the other subsequently-located points is measured and the one of the other points closest to the starting point (i.e., the closest point) is found (at step 704). The distance between points is measured by taking the square root of the sum of the squared differences between the x coordinates and the y coordinates of the points. Next, the array is reordered by swapping positions of the closest point and the point located in the array immediately subsequent to the starting point (at step 706). Next, the method proceeds to determine if each of the points of the array has served as the starting point and has been checked against each of the other points in subsequent array locations (at step 710). If not, the method returns to step 702 to select the next starting point from the array, which is the point in the array located immediately subsequent to the previously selected starting point. If all points have been checked, the method ends (at step 712) and the array is deemed to be ordered by distance.

Application of the method of FIG. 7 to the embodiment illustrated in FIG. 2 is depicted in TABLE 3 below, which is summarized as follows. The array [(18,12.75)(3.47,4)(18,4) (2.5,11.25)] is traversed, starting with point (18,12.75), and ordered by distance to achieve a reordered array [(18,12.75) (18,4)(3.47,4)(2.5,11.25)].

TABLE 3

| Array | Starting Point | Next Point(s) | Distance to Next Point(s) | Closest Point | Swapping Point | Reordered Array |
|---|---|---|---|---|---|---|
| 1: (18,12.75) | 1 | 2 | 16.94 | 3 | 2 | 1 |
| 2: (3.47,4) |   | 3 | 8.75 |   |   | 3 |
| 3: (18,4) |   | 4 | 15.57 |   |   | 2 |
| 4: (2.5,11.25) |   |   |   |   |   | 4 |
| 1 | 3 | 2 | 14.5 | 2 | — | — |
| 3 |   | 4 | 17.11 |   |   | (no change) |
| 2 |   |   |   |   |   |   |
| 4 |   |   |   |   |   |   |
| 1 | 2 | 4 | — | — | — | — |
| 3 |   | (stop - end of array) |   |   |   |   |
| 2 |   |   |   |   |   |   |
| 4 |   |   |   |   |   |   |

After the points are sorted by distance, the array is checked for convexity (at step 408 of FIG. 4). Convexity of the array exists if the line segments formed from the connection of neighboring array points do not intersect one another. Convexity is checked according to a method shown in FIG. 8. A line segment is selected to check for intersection (at step 802). The line segment is constructed by connecting neighboring array points (at step 804) and checked for intersection with each of the other line segments formed from connection of neighboring array points (at step 806). The line segments are checked for intersection according to the steps 506, 508, 510, 516, 518, 522, and 524 of the method shown in FIG. 5. However, line segments are not checked against themselves or against line segments that they should intersect with (i.e., line segments sharing the same endpoints).

If the selected line segment is found not to intersect any of the other line segments (at step 808 of FIG. 8) and all of the line segments have been checked against each other for intersection (at step 810), the method ends (at step 812). However, if all of the line segments have not been checked against each other for intersection (at step 810), the method returns to step 802 to select the next line segment to check for intersection.

If the selected line segment is found to intersect one of the other line segments (at step 808), the original order of the points in the array (i.e., the order of the array prior to the step of 406 of FIG. 4) is shuffled (at step 814). Shuffling is accomplished by moving the point from the first location in the array to the last location in the array while incrementing the location of each of the remaining points in the array. Once shuffled, the array is again sorted by distance (at step 816) according to the method of FIG. 7. Once sorting is completed, the method returns to step 802 of FIG. 8 to check for convexity in the newly ordered array.

Figure 8:
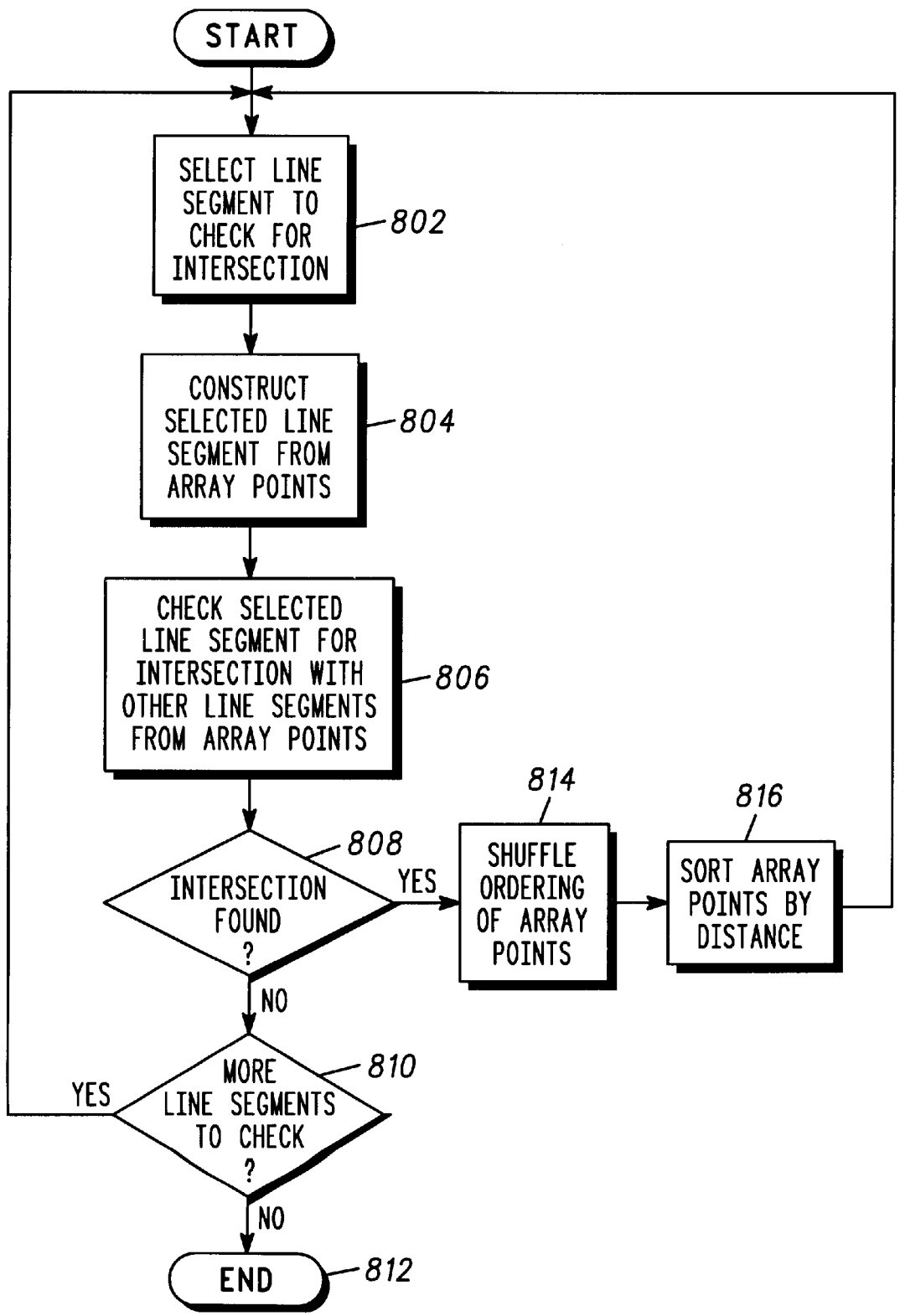
FIG. 8 is a flow chart illustrating a method of checking for convexity of the method of calculating placement coverage area of FIG. 4.

Application of the method of FIG. 8 to the embodiment illustrated in FIG. 2, results in no undesired intersections of line segments of the array [(18,12.75)(18,4)(3.47,4)(2.5, 11.25)]. Aside from performing the intersection calculations described above with respect to FIG. 5 (which will not be performed here for the sake of brevity), the nonintersection of the line segments may be evidenced from the distance calculations of TABLE 3. For example, the distance between points (18,12.75) and (18,4), which is along line segment 216, was calculated to be less than the diagonal distance between points (18,12.75) and (3.47,4). In the event that this diagonal distance was found to be less, the array would have been ordered by the method of FIG. 7 such that a diagonal line segment extending between points (18,12.75) and (3.47, 4) would be constructed in FIG. 8. The diagonal line segment would produce undesirable intersections when compared to other non diagonal line segments constructed from points of the array during the step 806 of FIG. 8.

Once the array is found to exhibit convexity, the area enclosed by the points of the array is calculated (at step 410 of FIG. 4). The enclosed area equals the product of one-half and the absolute value of the difference of (1) the sum of the products of (a) the x coordinate of each array point and (b) the y coordinate of each next array point; and (2) the sum of the products of (a) the y coordinate of each array point and (b) the x coordinate of each next array point. Regarding the embodiment illustrated in FIG. 2, the enclosed area of the array [(18,12.75)(18,4)(3.47,4)(2.5,11.25)] is calculated as follows:

$$\begin{aligned}
\text{Enclosed Area} &= 1/2*\text{abs}((x_1*y_2 + x_2*y_3 + x_3*y_4 + x_4*y_1) - \\
&\quad (y_1*x_2 + y_2*x_3 + y_3*x_4 + y_4*x_1)) \\
&= 1/2*\text{abs}((18*4 + 18*4 + 3.47*11.25 + 2.5*12.75) - \\
&\quad (12.75*18 + 4*3.47 + 4*2.5 + 11.25*18)) \\
&= 1/2*\text{abs}(-240.97) \\
&= 1/2*240.97 \\
&= 120.48.
\end{aligned}$$

Once the enclosed area of the array is calculated, coverage area of two polygons, such as the solder paste 200 and pad 202 of FIG. 2, can be determined (at step 412). Coverage area represents the percentage of one polygon, such as the solder paste 200, that overlies or intersects the other polygon, such as pad 202. Coverage area is calculated by dividing the enclosed area by an ideal overlap area that is computed assuming perfect alignment of the stencil of the paste placement machine and the substrate during the paste placement step 102 of FIG. 1. The ideal overlap area of pad 202 read from the database at step 304 of FIG. 3. Regarding the embodiment illustrated in FIG. 2, the paste to pad coverage area is calculated as follows:

$$\begin{aligned}
\text{Coverage Area} &= (\text{Enclosed Area})/(\text{Ideal Overlap Area})*100\% \\
&= (120.375)/(18*11.5)*100\% \\
&= (120.375)/(207)*100\% \\
&= 58.2\%.
\end{aligned}$$

Once the coverage area is calculated, the method of calculating the coverage area of two polygons of FIG. 4 ends (at step 414) and the step 310 of FIG. 3 of calculating paste to pad coverage area is completed.

Next, the paste placement measurement machine operating in accordance with the paste placement inspection step 103 of FIG. 1 determines if the solder paste is defectively placed on its corresponding pad by comparing the paste to pad coverage area calculated at the step 310 of FIG. 3 to a threshold value (at step 312). The threshold value defines the minimum amount of the solder that needs to overlay the pad to ensure physical and electrical connectivity of the solder to the pad. If the coverage area is greater than or equal to the threshold, the solder paste is deemed to be accurately placed and data regarding the solder paste, including the points defining the enclosed area calculated in steps 402–408 of FIG. 4, is output, as depicted by arrow 112 of FIG. 1, (at step 314 of FIG. 3). The method of FIG. 3 is then ended (at step 316). If the coverage area is found to be less than the threshold, the solder paste 200 is deemed to be defectively placed and the circuit assembly process 100 is deemed to be inaccurate. The substrate is removed from the circuit assembly process 100 of FIG. 1 and the paste placement step 102 is adjusted, as depicted by arrow 114, by adjusting, repairing, or replacing the stencil so that the solder paste 200 is accurately placed on subsequent substrates (at step 318). The method of FIG. 3 then ends at the step 316. In the illustrated embodiment and using a threshold of 50 percent, placement of the solder paste 200 on pad 202 and the circuit assembly process 100 is deemed to be accurate because the coverage area of the solder paste 200 on pad 202 is 58.2 percent, which is greater than the threshold, and the points defining the pad area enclosed by the solder paste 200, (18,12.75)(18,4)(3.47,4)(2.5,11.25), are output. Referring back to FIG. 1, the paste placement inspection step 103 is repeated for pad 204 of FIG. 2 and for pads of other sites of the substrate.

Figure 9:
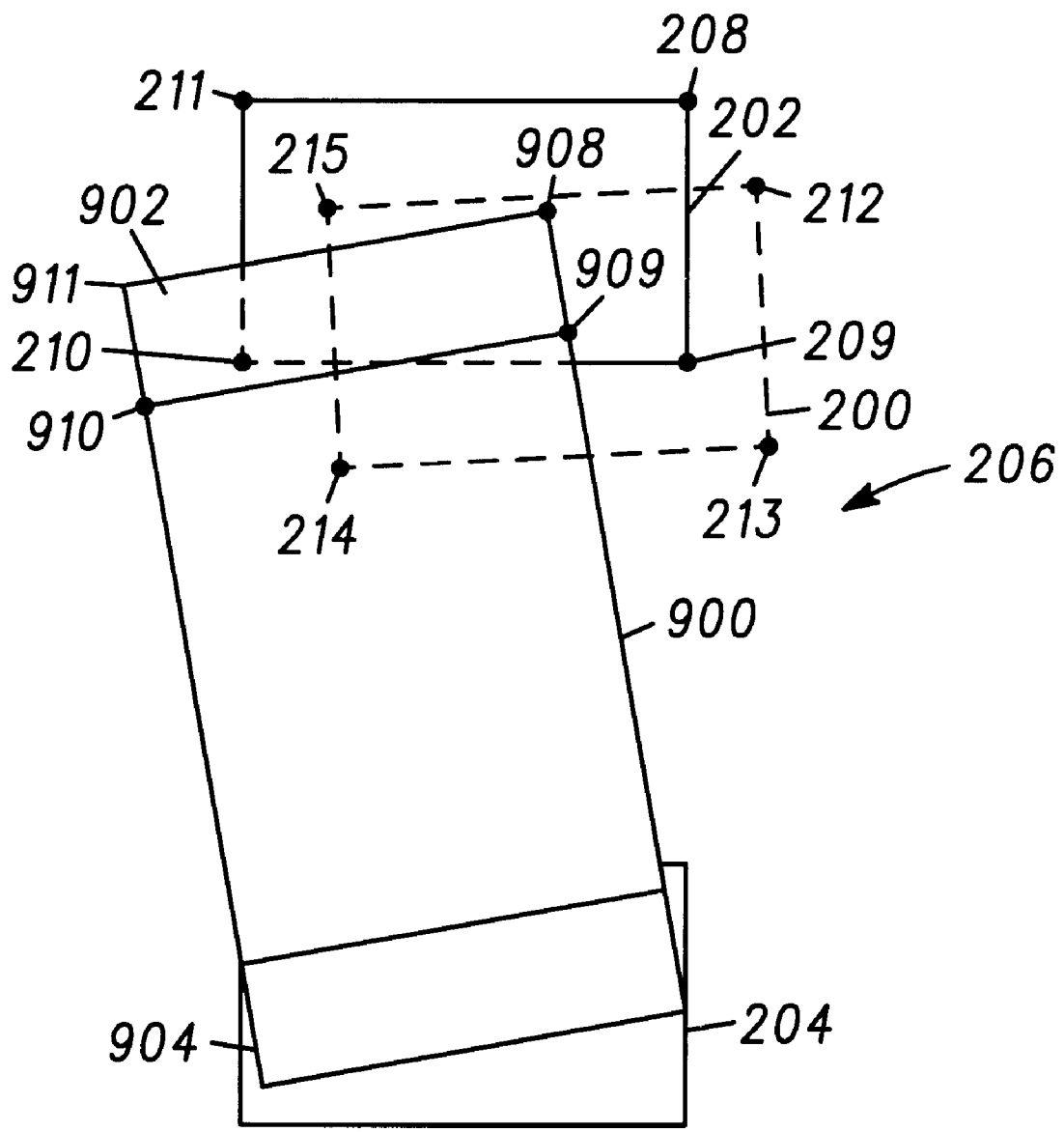
FIG. 9 is an enlarged, top plan view of a site of a substrate in the circuit assembly process of FIG. 1 following a part placement step thereof.

Following the paste placement inspection step 103, the circuit assembly process 100 proceeds to the part placement step 104, as depicted by arrow 116. During the part placement step 104, electronic parts, such as electronic part 900 of FIG. 9, are placed so that leads of the parts, such as leads 902 and 904 of part 900, overlie the solder paste 200, which is shown in broken line in FIG. 9 for clarity, and corresponding pads, such as pads 202 and 204, of all of the sites, such as site 206, of the substrate. Such placement forms assemblies having a part/lead component, a solder paste component, and a pad component. Placement of part 900 is performed by a known automated part placement machine. The part placement machine receives and locates the substrate and populates the substrate with the electronic parts, including part 900, as previously described. Sometimes, however, the part placement machine is out of alignment due to, for example, operator setup error or normal wear and tear, and one or more of the electronic parts is inaccurately placed.

Following the part placement step 104 of FIG. 1, the circuit assembly process 100 proceeds to the part placement inspection step 105, as depicted by arrow 118. At the part placement inspection step 105, all of the sites of the substrate, including site 206 of FIG. 9, are measured to determine the accuracy of the part placement step 104 of FIG. 1. Measurement is performed by a part placement measurement machine such as any of those cited above with respect to the paste placement inspection step 103 of FIG. 1, a model GS-1 Component Placement Measurement system manufactured and sold by MV Technology, or other suitable two-dimensional or three-dimensional sensing system.

Figure 10:
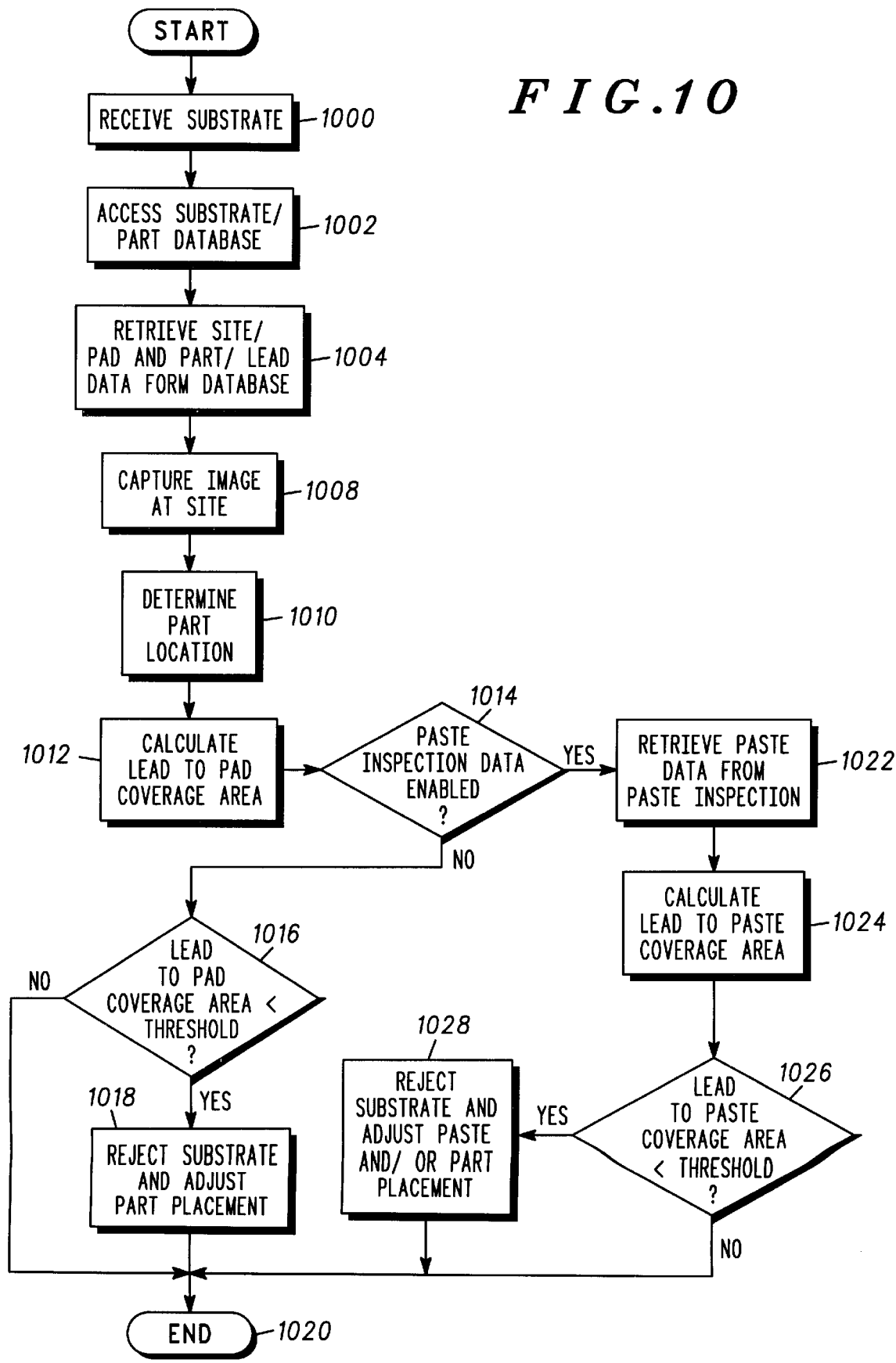
FIG. 10 is a flow chart illustrating a part placement inspection step of the circuit assembly process of FIG. 1.

The part placement inspection step 105 comprises a method shown in FIG. 10 for determining the accuracy of the part placement step 104 of FIG. 1. Steps of the method of FIG. 10 are defined in software instructions that are stored in a memory section of the part placement measurement machine and executed by a processing section of the part placement measurement machine. Initially, the part placement measurement machine receives the substrate and positions it for inspection (at step 1000). The part measurement machine accesses a database of prestored data corresponding to the topology of the substrate and the electronic parts (at step 1002). The part placement measurement machine retrieves data from the database that indicates the location of a site to inspect, such as site 206 of FIG. 9; the coordinates of corner points of one pad of the site, such as corner points 208–211 of pad 202; and the geometry of the part to inspect, such as part 900, and the location of its leads, such as leads 902 and 904, (at step 1004). Using the retrieved data, the part placement measurement machine captures an image at site 206 using its vision section (at step 1008). The part placement measurement machine processes the image using a known method, such as laser triangulation, gray scale, and/or color image processing, to determine coordinates of locator points, such as corner points 908–911 of lead 902 of part 900 relative to pad 202 (at step 1010). In the illustrated embodiment, the coordinates of the corner points 208–211 of pad 202 are (18, 15.5), (18, 4), (0, 4.0), and (0, 15.5), respectively, and the coordinates of corner points 908–911 of lead 902 are (8, 10.25), (9.5, 5.5), (−5.0, 0.921), and (−6.5, 5.671), respectively.

Next, the part placement inspection step 105 proceeds to calculate lead to pad coverage area (at step 1012). Lead to pad coverage area is calculated using the method described above in conjunction with FIGS. 4–8, where the lead of the part is modeled as one polygon and the pad is modeled as the other polygon. In the illustrated embodiment, the percentage of lead 902 that covers an ideal overlap area of pad 202, which is calculated by assuming perfect part placement (i.e., no offset or rotation), is found to be (Enclosed Area)/(Ideal Overlap Area)*100 percent, or (42.145)/(75.74)*100 percent, or 55.6 percent.

If configured to assume that the solder paste 200 was accurately placed during the paste placement step 102 of FIG. 1 and not to consider the paste data generated during the paste placement inspection step 103 and output at the step 314 of FIG. 3 (at step 1014), the part placement measurement machine determines if the part is defectively placed by comparing the lead to pad coverage area calculated at the step 1012 to a threshold, such as 50 percent (at step 1016). The threshold defines the minimum amount of the lead that needs to overlay the pad to ensure physical and electrical connectivity of the lead (and the part) to the pad. If the coverage area is, found to be greater than or equal to the threshold, the lead of the part is found to be accurately placed and the method of FIG. 10 is ended (at step 1020). If the coverage area is found to be less than the threshold, the part is deemed to be defectively placed and the circuit assembly process 100 is deemed to be inaccurate. The substrate is removed from the circuit assembly process 100 of FIG. 1 and the part placement step 104 is adjusted, as depicted by arrow 120, by adjusting or repairing the part placement machine so that the parts are accurately placed on subsequent substrates (at step 1018). The method of FIG. 10 then ends at the step 1020. In the illustrated embodiment and using a threshold of 50 percent, lead 902 of part 900 is found to be accurately placed because the lead to pad coverage area is 55.6 percent.

If enabled to use the solder paste data generated during the paste placement inspection step 103 of FIG. 1 (at step 1014), the part placement measurement machine receives the solder paste data output at the step 314 of FIG. 3 (at step 1022). The lead to paste coverage area is then calculated (at step 1024). Lead to paste coverage area is calculated using the method described above in conjunction with FIGS. 4–8, where the lead is one polygon and the enclosed area of the solder paste and the pad found in FIG. 3 is the other polygon. In the illustrated embodiment, the percentage of lead 902 that covers the enclosed area of the solder paste 200 and pad 202 defined by points (18, 12.75), (18, 4), (3.47, 4), and (2.5, 11.25) is calculated to be 38.1 percent. If the lead to paste coverage area is greater than or equal to a threshold (at step 1026), the lead and the solder paste are accurately placed and the method of FIG. 10 ends at the step 1020. If the lead to paste coverage area is found to be less than the threshold, the part and/or the solder paste is deemed to be defectively placed and the circuit assembly process 100 is deemed to be inaccurate. The substrate is removed from the circuit assembly process 100 of FIG. 1 and the paste and/or part placement steps 102 and 104 are adjusted, as depicted by arrow 121, by adjusting, repairing, or replacing the part and/or paste placement machine so that the solder paste and/or the parts are accurately placed on subsequent substrates (at step 1028). The method of FIG. 10 then ends at the step 1020. In the illustrated embodiment and using a threshold of 50 percent, lead 902 of part 900 is found to be inaccurately placed because the lead to paste coverage area is 38.1 percent. Referring to FIG. 1, the part placement inspection step 105 is repeated for lead 904 of FIG. 9 and for the leads of other electronic parts placed on the sites of the substrate.

Although steps 102–105 and 105 of FIG. 1 are described in reference to part 900 of FIG. 9, which may be a chip capacitor, resistor, or other two leaded device, and site 206 having pads 202 and 204 arranged according to part 900, it will be recognized that such discussions are by example only and that other leaded devices and the pads of sites arranged to accommodate them may also be inspected according to the methods illustrated and described herein. Such other leaded parts compatible with other pad arrangements include, but are not limited to, a SOT (small outline transistor) or other three leaded part; a SOIC (small outline integrated circuit), a TSOP (thin, small outline package), or other multiple leaded part with two lead rows; and a PQFP (plastic quad flat pack), TQFP (thin quad flat pack), or other multiple leaded part with four lead rows.

To minimize inspection time of multiple leaded parts, only the critical leads and pads are inspected during the part placement inspection step 105 of FIG. 1. For parts with two or three leads, all pads and leads, respectively, are inspected. For parts with two or more rows of two or more leads, only the first and last pads and leads, respectively, of each row are inspected.

Following the part placement inspection step 105, the circuit assembly process 100 proceeds to the reflow step 106, as depicted by arrow 122. During the reflow step 106, the substrate is heated to a temperature sufficient to melt the solder paste 200 of FIGS. 2 and 9. The melted solder paste adheres to the electronic parts, including part 900, to form an intermetallic, electrically conductive bond between the leads of the parts and the pads, such as leads 902 and 904 of part 900 and pads 202 and 204 upon cooling. Once cooled, the circuit assembly process 100 proceeds to the unload step 107, as depicted by arrow 124, where the substrate, fully assembled and inspected, is removed from the circuit assembly process 100.

Thus, it can be seen that accuracy of a circuit assembly process can be measured by detecting and evaluating the coverage of the assembly. The accuracy of placement of solder paste on pads of a substrate site is determined by detecting and calculating the amount of solder paste and pad overlap. The accuracy of placement of electronic parts on pads of a substrate site is determined by detecting and evaluating the amount of overlap between the leads of the part and the pad. In addition, solder paste and pad coverage calculated in one step of the circuit assembly process may be dynamically used in a later step to more accurately measure part placement. As a result, the accuracy of the circuit assembly process can be measured by the interaction of paste, pads, and parts, rather than the individual locations of the paste, pads, and parts.

While particular embodiments of the present invention have been shown and described, modifications may be made. For example, pads 202 and 204 and/or leads 902 and 904 could alternatively be teardrop, circular, or other geometric shape that lacks vertexes. Non-vertexed shapes are modeled as a polygon for the coverage calculation of FIG. 4 as a series of adjoining line segments that are tangential to curved portions of the shape. Furthermore, although specifically directed to calculation of coverage area, one skilled in the art will recognize that paste to pad coverage volume may also be calculated by considering paste height measurements, which are made during processing of the image at the step 308 of FIG. 3, in conjunction with the area measurements of the method of FIG. 4, and, thus, "coverage" as used herein shall refer to either area coverage or volume coverage. Additionally, it will be recognized that other methods of calculation, such as using affine transforms or other algorithms, may alternatively be employed to determine coverage. It is therefore intended in the appended claims to cover all such changes and modifications which fall within the true spirit and scope of the invention.

What is claimed is:

1. A method for determining accuracy of a circuit assembly process, the method comprising the steps of:

capturing an image of an assembly of a substrate, the assembly formed by the circuit assembly process, the image comprising a first shape representative of a first component of the assembly and a second shape representative of a second component of the assembly;

identifying a first set of numeric coordinates defining a location of the first shape and a second set of numeric coordinates defining a location of the second shape;

determining coverage of the assembly by calculating overlap of the first and second components from the first and second sets of numeric coordinates; and comparing the coverage to a threshold to determine accuracy of the circuit assembly process.

2. A method according to claim 1 wherein the step of determining coverage comprises the steps of:

modeling the first component of the assembly as a first polygon and the second component of the assembly as a second polygon;

calculating points of intersection of the first polygon and the second polygon from the first and second sets of numeric coordinates; and calculating points of enclosure of the first polygon and the second polygon from the first and second sets of numeric coordinates.

3. A method according to claim 2 wherein the step of determining coverage comprises the step of sorting the points of intersection and the points of enclosure.

4. A method according to claim 3 wherein the step of sorting comprises the steps of:

selecting one of the points of intersection and the points of enclosure;

determining a distance between the one of the points of intersection and the points of enclosure and other ones of the points of intersection and the points of enclosure; and reordering the points of intersection and the points of enclosure by placing a closest one of the other ones of the points of intersection and the points of enclosure next to the one of the points of intersection and the points of enclosure.

5. A method according to claim 2 wherein the step of calculating comprises the step of computing an area enclosed by the points of intersection and the points of enclosure.

6. A method according to claim 1 further comprising the step of placing solder paste at a site of the substrate to form the assembly, the site having a pad; and wherein the step of capturing an image comprises the steps of:

defining the solder paste as the first component; and defining the pad as the second component.

7. A method according to claim 6 further comprising the step of outputting data regarding the overlap of the solder paste and the pad when the circuit assembly process is determined to be accurate.

8. A method according to claim 1 further comprising the step of placing an electronic part at a site of the substrate to form the assembly, the electronic part having at least one lead, and the site having at least one pad covered by solder paste; and wherein the step of capturing an image comprises the steps of:

defining the at least one lead as the first component; and defining the at least one pad covered by solder paste as the second component.

9. A method according to claim 8 wherein the step of determining coverage comprises the step of detecting an amount that first and last leads in at least two rows of the at least one lead overlaps first and last pads in at least two rows of the at least one pad.

10. A method for determining accuracy of a circuit assembly process, the method comprising the steps of:

capturing an image of an assembly of a substrate, the assembly formed by the circuit assembly process;

calculating coverage of the assembly from the image, the step of calculating comprising the steps of:

modeling a first component of the assembly as a first polygon and a second component of the assembly as a second polygon;

determining points of intersection of the first polygon and the second polygon, the step of determining points of intersection comprising the steps of:

constructing a first line segment from locator points of the first polygon;

constructing a second line segment from locator points of the second polygon;

determining a slope of the first and second line segments;

determining an intercept of non-vertical ones of the first and second line segments;

calculating a first point of intersection of the first and second line segments; and determining if the first point of intersection lies between the locator points of the first and second line segments; and determining points of enclosure of the first polygon and the second polygon; and comparing the coverage to a threshold to determine accuracy of the circuit assembly process.

11. A method for determining accuracy of a circuit assembly process, the method comprising the steps of:

capturing an image of an assembly of a substrate, the assembly formed by the circuit assembly process;

calculating coverage of the assembly from the image, the step of calculating comprising the steps of:

modeling a first component of the assembly as a first polygon and a second component of the assembly as a second polygon;

determining points of intersection of the first polygon and the second polygon; and determining points of enclosure of the first polygon and the second polygon, the step of determining points of enclosure comprising the steps of:

selecting a locator point of the first polygon;

selecting a line segment of the second polygon;

selecting a reference point of the second polygon; and determining if the locator point and the reference point are on a same side of the line segment; and comparing the coverage to a threshold to determine accuracy of the circuit assembly process.

12. A method for determining accuracy of a circuit assembly process, the method comprising the steps of:

placing solder paste at a site of a substrate to form an assembly, the site having a pad, the assembly formed by the circuit assembly process;

capturing an image of the assembly of the substrate;

calculating coverage of the assembly from the image, the step of calculating coverage comprising the step of detecting an amount of overlap of the solder paste and the pad;

comparing the coverage to a threshold to determine accuracy of the circuit assembly process;

outputting data regarding the overlap of the solder paste and the pad when the circuit assembly process is determined to be accurate;

placing an electronic part at the site of the substrate, the electronic part having a lead overlying the pad and the solder paste;

receiving the data regarding the overlap of the solder paste and the pad;

capturing an image of the assembly of the substrate; and calculating coverage of the assembly from the image, the step of calculating comprises the step of detecting an amount that the lead overlaps the overlap of the solder paste and the pad.

13. A method according to claim 12 further comprising the step of adjusting any of the steps of placing solder paste and placing the electronic part when the amount that the lead overlaps the overlap of the solder paste and the pad is below a threshold.

14. A method for determining accuracy of a circuit assembly process, the method comprising the steps of:

placing an electronic part at a site of a substrate, the electronic part having a lead, and the site having a pad covered by solder paste; and inspecting the part according to the substeps of:

modeling the lead as a first polygon and the pad as a second polygon, determining points of intersection of the first polygon and the second polygon, determining points of enclosure of the first polygon and the second polygon, sorting the points of intersection and the points of enclosure, and computing an area enclosed by the points of intersection and the points of enclosure, comparing the enclosed area to an ideal overlap area, and determining the lead to be defectively placed when the enclosed area is less than a percentage of the ideal overlap area.

15. A measurement machine for determining accuracy of a circuit assembly process, the machine comprising:

a vision section to capture an image of an assembly of a substrate, the image comprising a first shape representative of a first component of the assembly and a second shape representative of a second component of the assembly; and a processing section coupled to the vision section, the processing section to identify a first set of numeric coordinates defining a location of the first shape, identify a second set of numeric coordinates defining a location of the second shape, determine coverage of the assembly by calculating overlap of the first and second components from the first and second sets of numeric coordinates and determine accuracy of the circuit assembly process from the coverage.

16. A measurement machine according to claim 15 further comprising a memory section; and wherein the processing section calculates overlap according to software instructions stored in the memory section.

17. A measurement machine according to claim 15 wherein the vision section captures the image of the assembly using two-dimensional sensing or three-dimensional sensing.

18. A method for determining accuracy of a circuit assembly process, the method comprising the steps of:

placing solder paste at a site of a substrate, the site having a pad; and inspecting the site according to the substeps of:

modeling the solder paste as a first polygon defined by a first set of numeric coordinates and the pad as a second polygon defined by a second set of numeric coordinates, determining points of intersection of the first polygon and the second polygon, the points of intersection occurring where line segments defined by the first set of numeric coordinates intersect with line segments defined by the second set of numeric coordinates, determining points of enclosure of the first polygon and the second polygon, the points of enclosure occurring where coordinates of the first set of numeric coordinates are located within the second polygon or coordinates of the second set of numeric coordinates are located within the first polygon, sorting the points of intersection and the points of enclosure, and computing an area enclosed by the points of intersection and the points of enclosure, comparing the enclosed area to an ideal overlap area, and determining the solder paste to be defectively placed when the enclosed area is less than a percentage of the ideal overlap area.

* * * * *